United States Patent
Werner et al.

(10) Patent No.: US 11,871,550 B2
(45) Date of Patent: Jan. 9, 2024

(54) MOTOR CONTROLLED RETRACTABLE EMC PROTECTION

(71) Applicant: INTERNATIONAL BUSINESS MACHINES CORPORATION

(72) Inventors: John S. Werner, Fishkill, NY (US); Noah Singer, White Plains, NY (US); Samuel R. Connor, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 17/451,839

(22) Filed: Oct. 22, 2021

(65) Prior Publication Data

US 2023/0128028 A1 Apr. 27, 2023

(51) Int. Cl.
H05K 9/00 (2006.01)

(52) U.S. Cl.
CPC ........... *H05K 9/002* (2013.01); *H05K 9/0007* (2013.01); *H05K 9/0015* (2013.01); *G05B 2219/24024* (2013.01)

(58) Field of Classification Search
CPC .......... H05K 9/0007–0062; G05B 2219/24024
See application file for complete search history.

(56) References Cited

U.S. PATENT DOCUMENTS

| | | | |
|---|---|---|---|
| 3,518,355 A | 6/1970 | Luce | |
| 3,783,429 A | 1/1974 | Otte | |
| 5,091,823 A | 2/1992 | Kanbara | |
| 5,092,781 A | 3/1992 | Casciotti | |
| 5,483,423 A | 1/1996 | Lewis | |
| 5,563,390 A | 10/1996 | Demissy | |
| 5,637,001 A | 6/1997 | Nony | |
| 6,396,382 B1 | 5/2002 | Ross | |
| 6,501,019 B2 | 12/2002 | Sato | |
| 6,709,286 B1 | 3/2004 | Korsunsky | |
| 6,794,571 B1 | 9/2004 | Barringer | |
| 6,870,093 B2 | 3/2005 | King, Jr. | |

(Continued)

FOREIGN PATENT DOCUMENTS

| | | |
|---|---|---|
| CN | 112492864 A | 3/2021 |
| DE | 102010031035 B3 | 1/2012 |

(Continued)

OTHER PUBLICATIONS

Notice of References Cited, U.S. Appl. No. 17/451,833, dated May 4, 2023.

(Continued)

*Primary Examiner* — Jacob R Crum
(74) *Attorney, Agent, or Firm* — Nathan M. Rau

(57) ABSTRACT

A system and method for controlling an EMC protection apparatus in a removable component. The removable component is inserted into an end product. As a result of the insertion power is applied to the EMC protection apparatus. A determination is made as to whether a power good signal is detected within the removable component. In response to a power good signal, an EMC protection device is rotated from a retracted state to an engaged state such that the EMC protection device is placed over an enclosure opening in the removable component forming an EMC seal. Full functionality of the removable component can be delayed until such time as the rotation is completed.

11 Claims, 4 Drawing Sheets

(56) References Cited

U.S. PATENT DOCUMENTS

| | | |
|---|---|---|
| 6,924,988 B2 | 8/2005 | Barringer |
| 6,930,892 B2 | 8/2005 | Barringer |
| 7,081,587 B1 | 7/2006 | Woolsey |
| 7,215,536 B2 | 5/2007 | Hensley |
| 7,532,469 B2 | 5/2009 | Frank |
| 7,683,267 B2 | 3/2010 | Peets |
| 7,837,503 B2 | 11/2010 | Hartzell |
| 7,881,052 B2 | 2/2011 | Crippen |
| 7,997,906 B2 | 8/2011 | Ligtenberg |
| 8,638,570 B2 | 1/2014 | Liu |
| 9,054,804 B2 | 6/2015 | McColloch |
| 9,200,709 B2 | 12/2015 | Eidem |
| 10,362,716 B2 * | 7/2019 | Besterman ........... H05K 9/0081 |
| 10,477,740 B2 | 11/2019 | Coppola |
| 10,575,448 B1 | 2/2020 | Lewis |
| 10,642,327 B1 | 5/2020 | Silvanto |
| 2005/0023904 A1 * | 2/2005 | Cara ................... H05K 9/0039 |
| | | 310/10 |
| 2006/0261710 A1 | 11/2006 | Frank |
| 2006/0262512 A1 | 11/2006 | Klein |
| 2007/0007037 A1 | 1/2007 | Diaferia |
| 2007/0071575 A1 | 3/2007 | Rudduck |
| 2007/0114060 A1 | 5/2007 | Barringer |
| 2013/0155603 A1 * | 6/2013 | Kaneko ................ G11B 25/043 |
| | | 361/679.33 |
| 2015/0070840 A1 | 3/2015 | Rappoport |
| 2017/0178942 A1 * | 6/2017 | Sakata ............. H01L 21/67775 |
| 2019/0040675 A1 | 2/2019 | Alexander |

FOREIGN PATENT DOCUMENTS

| | | |
|---|---|---|
| EP | 0665564 B1 | 1/1998 |
| JP | 2001168572 A | 6/2001 |
| JP | 2004207722 A | 7/2004 |

OTHER PUBLICATIONS

Notice of References Cited, U.S. Appl. No. 17/451,830, dated Feb. 16, 2023.

List of IBM Patents or Patent Applications Treated as Related.

* cited by examiner

MOTOR CONTROLLED RETRACTABLE EMC PROTECTION

BACKGROUND

The present disclosure relates to electromagnetic compatibility protection, and more specifically, to a motor controlled retractable EMC protection apparatus for a removeable component.

For enclosures such as servers, IO drawers, and processor drawers that are densely packed and have removable components such as power supplies and IO cards it is difficult to add EMI/EMC protection due to the space restrictions on either the removable component or the enclosure. Further, due to the tight space there is a high risk of damaging the protection during plug in or plug out events.

SUMMARY

According to embodiments of the present disclosure, a retractable electromagnetic compatibility (EMC) protection apparatus for a removable component is disclosed. The EMC protection apparatus includes a motor mounting bracket attached to a side of the removable component and a rotational motor coupled to the motor mounting bracket. A motor swing arm is connected to the rotational motor. The motor swing arm is also connected to a protection mounting bracket. An EMC protection device is mounted on to the protection mounting bracket. The EMC protection device is configured to be rotated in and out of an enclosure opening of the removable component in response to rotation of the rotational motor to form an EMC seal on the removable component.

According to embodiments of the present disclosure, a method for controlling an EMC protection apparatus in a removable component is disclosed. The removable component is inserted into an end product. As a result of the insertion power is applied to the EMC protection apparatus. A determination is made as to whether there is good power to the EMC protection apparatus. In response to a power good signal, an EMC protection device is rotated from a retracted state to an engaged state such that the EMC protection device is placed over an enclosure opening in the removable component forming an EMC seal. In some embodiments, full functionality of the removable component is delayed until such time as the rotation is completed. In some embodiments, the method detects when power has been removed from the EMC protection apparatus. In response to this detection the full functionality of the removable component is stopped and the EMC protection device rotates back to the retracted state. The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
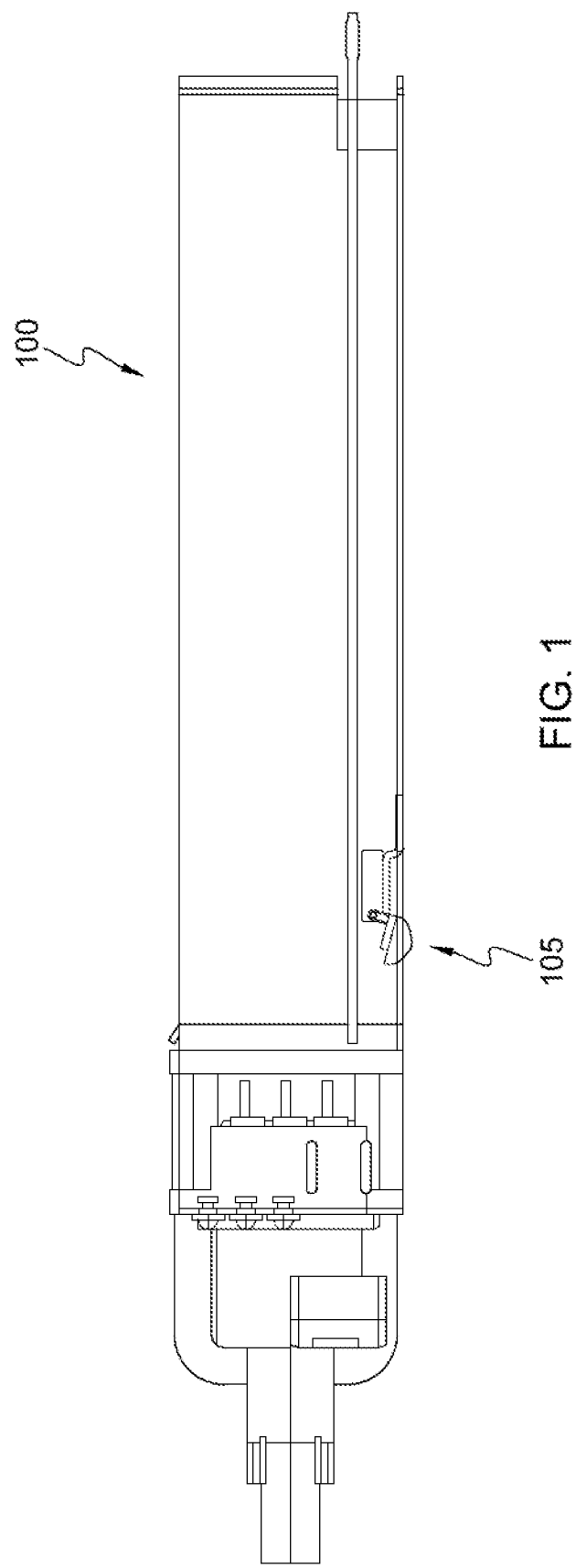
FIG. 1 is a diagrammatic illustration of a removable component according to embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to electromagnetic compatibility protection, more particular aspects relate to a motor controlled retractable EMC protection apparatus for removeable components. While the present disclosure is not necessarily limited to such applications, various aspects of the disclosure may be appreciated through a discussion of various examples using this context.

Enclosures such as servers IO draws, processor drawers, etc. are often densely packed with components. Some of these components are removable components, such as power supplies or IO cards. Due to space restrictions on either the removable component or the enclosure, it can be difficult to add electromagnetic interference (EMI)/electromagnetic compatibility (EMC) protection (e.g., gaskets, EMI springs, electrical noise absorbers) to the system. Often, if EMC protection is added in tight areas, problems such as shearing of a gasket during a plug/unplug event or high plug force can occur. However, if EMC protection is not used, there is a high potential for radiated emissions leakage, lack of immunity, and/or high ESD susceptibility through the unprotected slot. As speeds increase and higher frequency content is introduced, there is higher chance that this could lead to the associated product failing EMC certification tests.

The present disclosure provides a solution to the above identified issues related to the removable components and the needed EMI/EMC protection. The present disclosure provides an apparatus wherein EMC gaskets and/or springs are retracted into a removable component on one or more sides that provides a low plug force and prevents shearing during a plug/unplug event. The apparatus contains a motor (e.g., servo motor) that controls position of the EMC gaskets and/or springs. When there is no power to the motor, the EMC gaskets and/or springs are retracted into the removable component. When power is applied to the motor, the EMC gaskets and/or springs are rotated to extend outside the removable component and wipe against an adjacent surface creating an EMC seal between the two surfaces to minimize radiated emissions leakage, increase immunity, and/or lower ESD susceptibility. In some embodiments the apparatus can be implanted on the removable component or on the enclosure side where the removable component inserts into the enclosure.

FIG. 1 is a side view of a removable component 100 according to embodiments of the present disclosure. In FIG. 1 the removable component 100 is illustrated as a power supply unit (PSU). However, it could be any other type of removable component such as an input/output card, fan assembly, etc. Removable component 100 includes an EMC protection apparatus 105 that is located on the bottom of the removeable component 100. However, the EMC protection apparatus 105 can be located on other locations in the removable component 100. Further, in some embodiments, there can be multiple instances of the EMC protection apparatus 105 located on different sides of the removable component. In some embodiments, the EMC protection apparatus 105 can be located in the end product that the removable component 100 is inserted into, such as a server rack or other enclosure. However, for purposes of this disclosure, the EMC protection apparatus 105 will be discussed as being inside the removable component 100.

Figure 2:
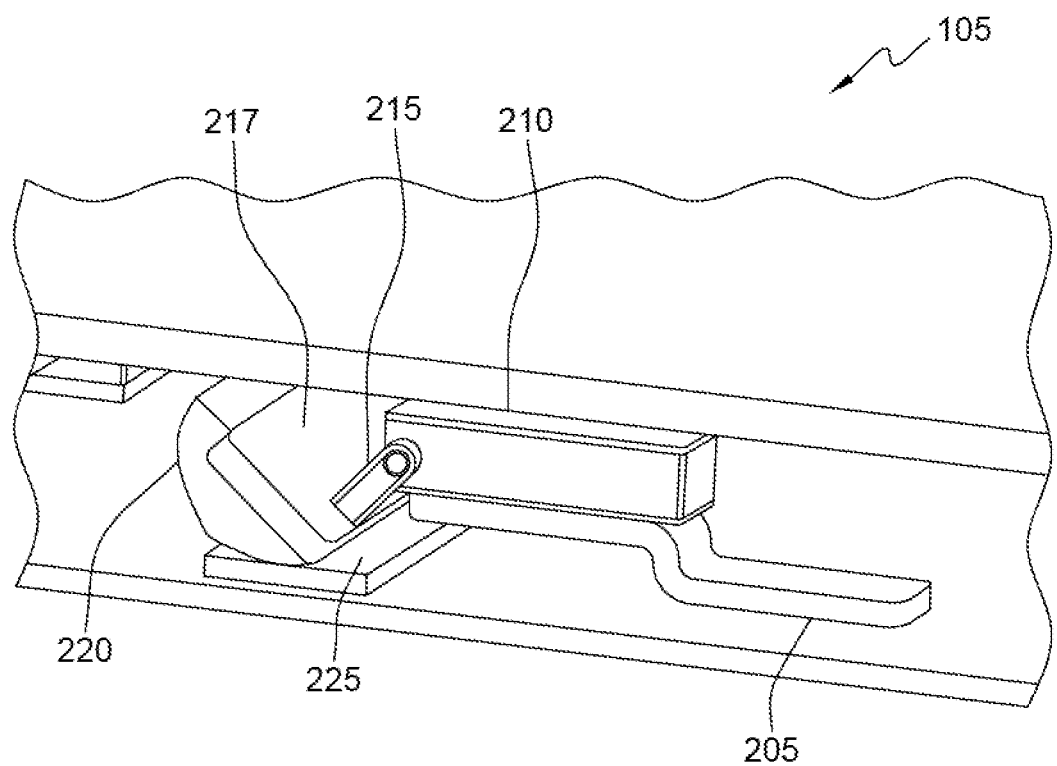
FIG. 2 is an orthogonal view of the rear of the EMC protection apparatus according to embodiments of the present disclosure.
Figure 3:
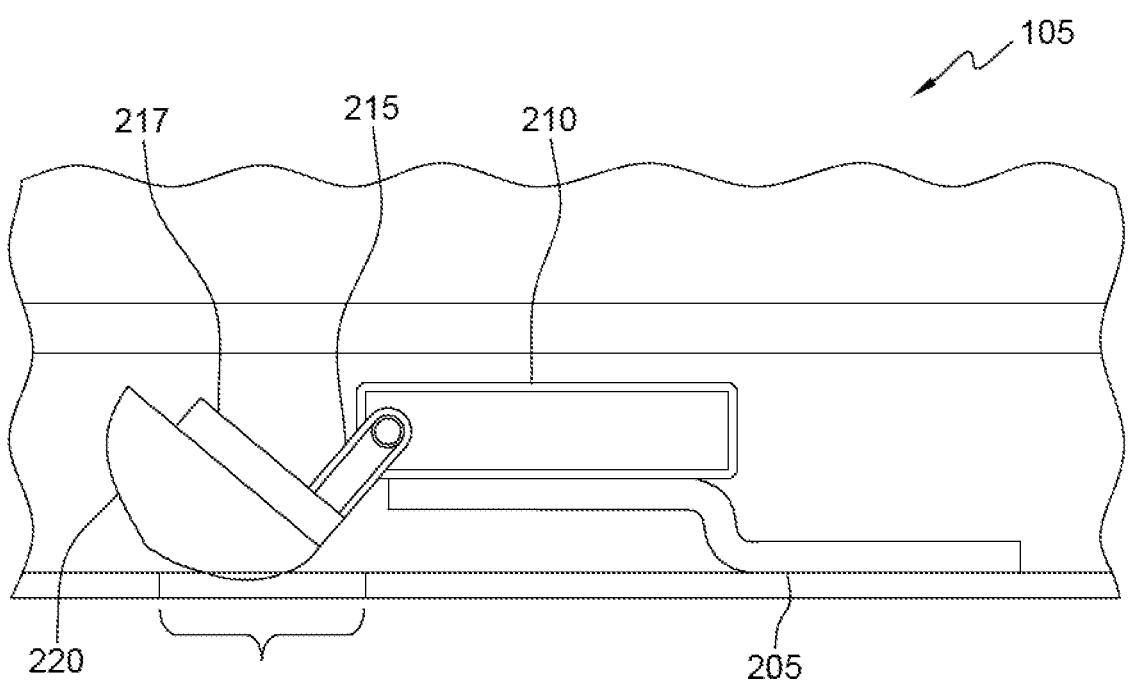
FIG. 3 is a side view of the EMC protection apparatus in the retracted state according to embodiments.
Figure 4:
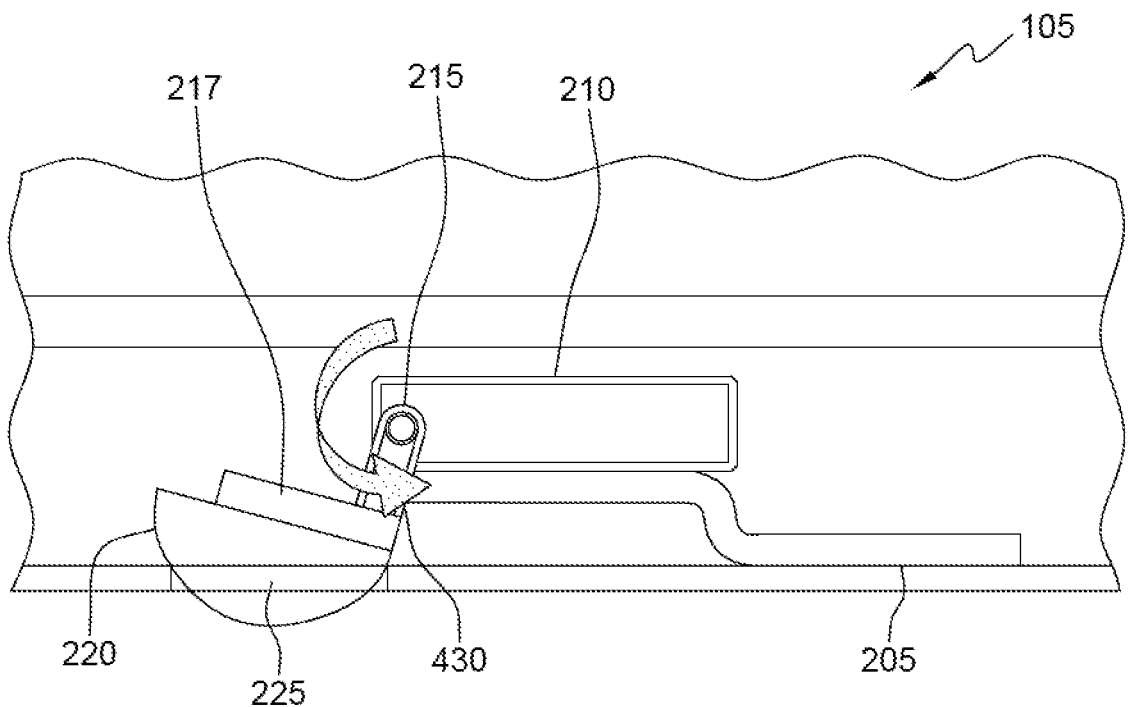
FIG. 4 is a side view of the EMC protection apparatus in the engaged state according to embodiments.
Figure 5:
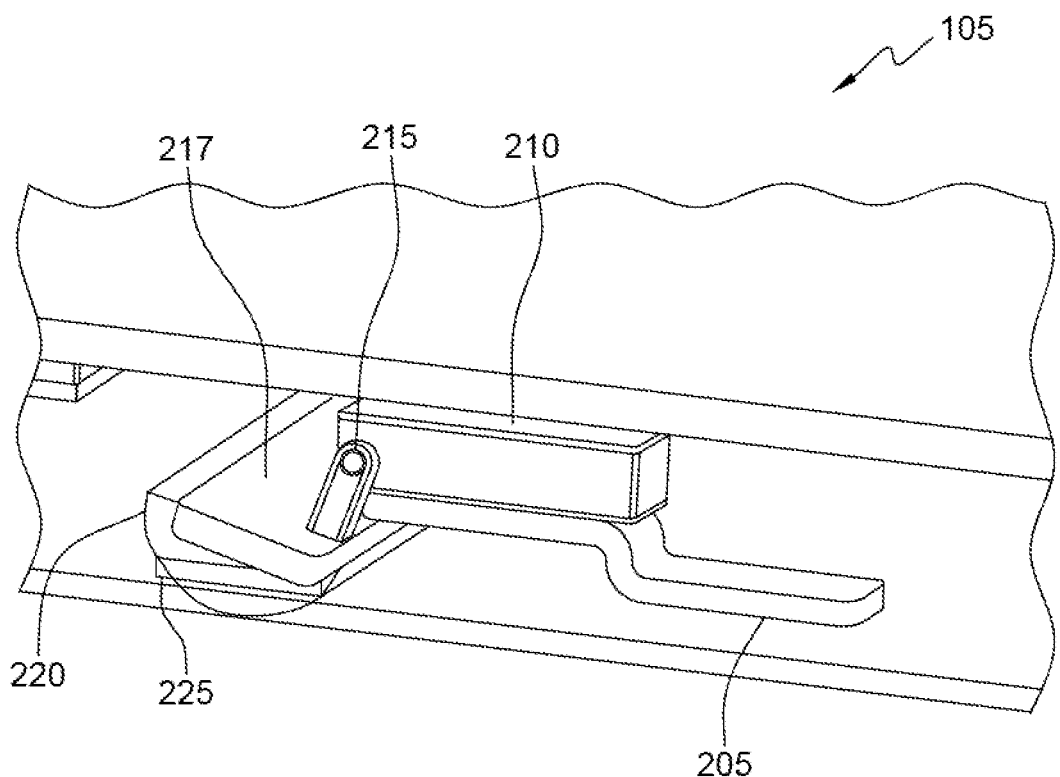
FIG. 5 is an orthogonal view of the EMC protection apparatus in the engaged state according to embodiments. according to embodiments of the present disclosure.

FIG. 2 is a orthogonal view of the EMC protection apparatus 105 according to embodiments. In FIG. 2 the EMC protection apparatus 105 is illustrated in its retracted state that is when there is no power being delivered to the apparatus 105. FIG. 3 is a side view of the EMC protection apparatus in the retracted state according to embodiments. FIG. 4 is a side view of the EMC protection apparatus in the engaged state according to embodiments. FIG. 5 is an orthogonal view of the EMC protection apparatus in the engaged state according to embodiments. The EMC protection apparatus 105 includes a motor mounting bracket 205, rotational motor 210, motor swing arm 215, protection device mounting bracket 217, and EMC protection device 220.

The motor mounting bracket 205 is used to attach the EMC protection apparatus 105 to removable component 100 as well as lifting the rotational motor 210 off the enclosure wall of removable component 100 to allow room for a swinging action when power is applied.

The rotational motor 210 (e.g., servo motor) is a component of the EMC protection apparatus that is configured to control the position of the motor swing arm 215. The rotational motor 210 moves the motor swing arm from a rest position (illustrated in FIGS. 2 and 3) to an engaged position (illustrated in FIGS. 4 and 5). The rotational motor can be, for example, a servo motor that moves the motor swing arm in response to power being applied. However, any other device that can rotate the motor swing arm in response to an applied power can be used. The rotational motor increases the effectiveness of a wiping action that is performed between EMC protection device 220 and an adjacent conductive surface during activation and sealing. In contrast a linear motor cannot create the same wiping action and as such inhibits and/or prevents an effective EMC seal. This wiping action between the EMI gasket on the EMC protection device and the mating metal surface helps to cut through any anti-fingerprint coatings or oxidation on the metal surface that prevents making a good, low-resistance electrical connection.

Motor swing arm 215 is the attachment between rotational motor 210 and protection device mounting bracket 217 and travels along rotation path 430 as shown in FIG. 4. The protection device mounting bracket 217 is where the EMC protection device 220 is mounted and runs the full length of enclosure opening 225.

The EMC protection device 220 lowers when power is applied to rotational motor 210 to provide adequate sealing on all sides of enclosure opening 225 and stick out far enough to compress against another surface (either the end product or a second removable component 100) and seal off any openings for good EMC containment. An important feature of this design is that EMC protection device 220 rotates into place simulating the same wiping action against a neighboring surface that would be experienced when a standard removable component with a fixed gasket is inserted into an end product (adequate wiping has been proven to show increased performance in EMC gaskets). This wiping action between an EMI gasket that is a component of the EMC protection device 220 and the mating metal surface helps to cut through any anti-fingerprint coatings or oxidation on the metal surface that prevent making a good, low-resistance electrical connection. The EMC protection device 220 seals all sides of enclosure opening 225 when engaged to ensure that there are no leakage paths. The EMC protection device 220 is sized and placed such that when it is inserted into the enclosure opening 225 the gasket is as close to the external surface of the removable component 100 as is possible. This is obtained by compressing the EMC protection device 220 into the enclosure opening 225 and contacting a component outside of the removeable component. In some embodiments this compression results in the EMC protection device 220 being compressed between 30 and 70 percent of its original height. (i.e., height prior to insertion). In some embodiments the EMC protection device 220 has a bell or other curved shape such that the curve extends towards or into the enclosure opening. However, any shape can be used for the EMC protection device so long as it can completely seal the enclosure opening. By not engaging the EMC protection device 220 prior to the insertion of the removable component 100 into the end product, a lower plug force is obtained than would be possible using traditional methods.

The enclosure opening 225 is an intentional opening left in the enclosure of the removable component 100 that should extend the desired length for which EMC containment is desired based on the frequencies present in the end product. In some embodiments, EMC containment will need to be present on all sides of the removable component 100. In these cases, the EMC protection apparatus 105 can be implemented on all sides of removable component 100 where there is not EMC containment already present when the removable component is inserted into the end product. For example, if a cubby hole for a PSU has gaskets on the left and right sides of the end product, then the EMC protection apparatus 105 may only need to be implemented on the top and bottom surfaces of the PSU. In another example, an IO cassette may need the EMC protection apparatus 105 implemented on three sides because the fourth side is sealed by an EMC protection apparatus of another neighboring IO cassette.

Figure 6:
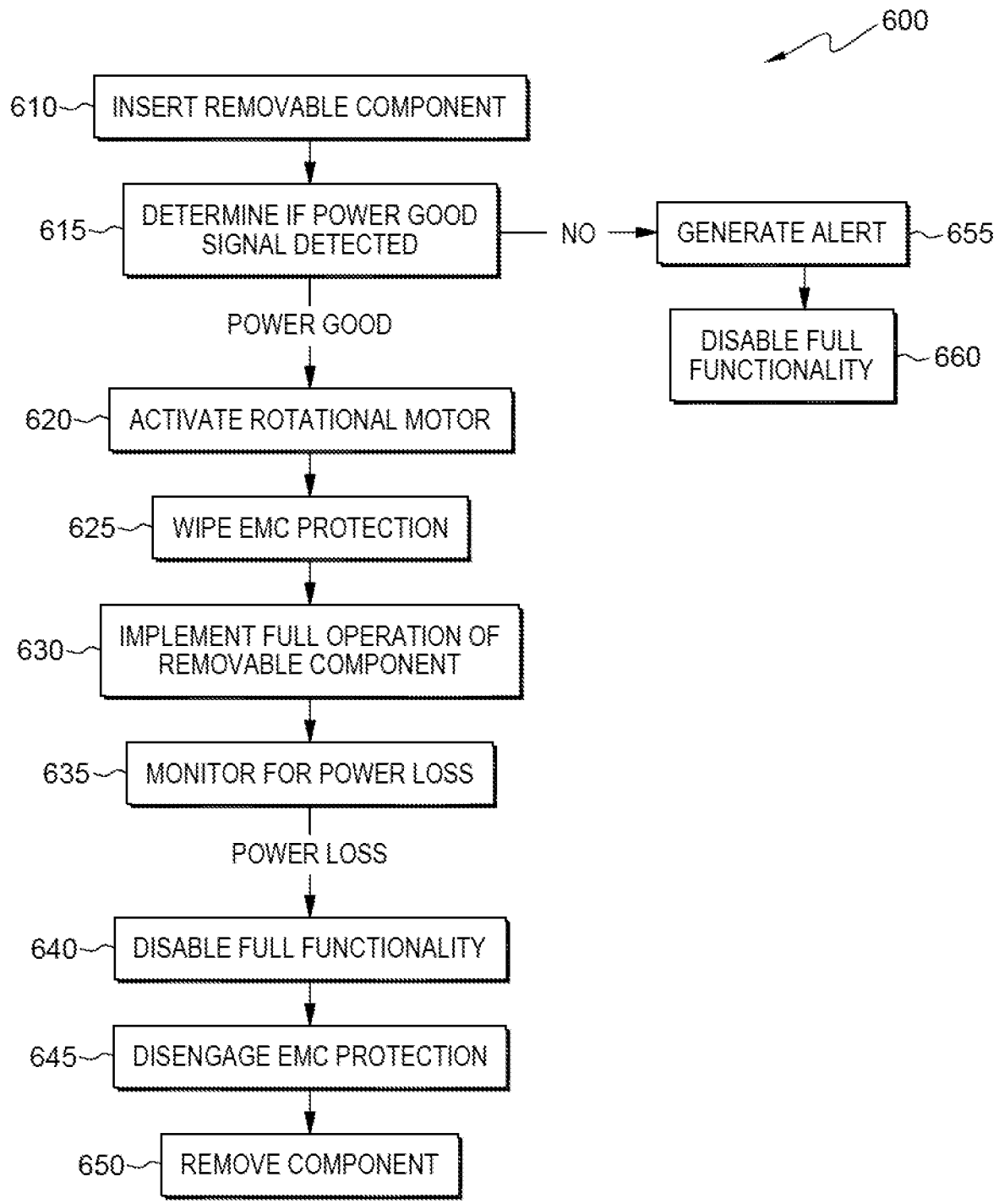
FIG. 6 is a flow chart illustrating a process for controlling a removable component having the EMC protection apparatus according to embodiments of the present disclosure.

FIG. 6 is a flow chart illustrating a process 600 for controlling a removable component having the EMC protection apparatus 105 of the present disclosure according to various embodiments. The EMC protection apparatus can include circuitry that enables the implementation of process 600. For example, the circuitry can be implemented by an ASIC that is coupled to the protection apparatus 100, or through a processing system onboard the removable component. The process begins with a user inserting the removable component 100 into an end product. This is illustrated at step 610. For example, the user could be inserting a power supply into a server computer. However, the user could be inserting any other removable component such as a fan, an IO card, etc. into any end product.

As a result of the insertion into the end product, power is applied to the removable component 100. In some embodiments, power can be applied through a connector on the end product when the removable component 100 is inserted. Alternatively, power can be applied by the user plugging a power cable into the removable component 100 after it is plugged into the end product.

The process then determines if it can detect a power good signal for the power at the rotational motor 210. This is illustrated at step 615. If a power good signal is detected at the rotational motor 210, the process 600 moves to step 620 where the rotational motor 210 activates to engage the EMC protection device 220 as illustrated in FIGS. 4 and 5.

At this point, full functionality of the removable component has not been activated. For example, the input/output signals of a PCI card are not yet being transmitted and received. The process delays the activation of the removable component 100 to allow the EMC protection device 220 to wipe and adjacent surface and fully engage. This is illustrated at step 625. Following the wiping, full function of the removable component is enabled. This is illustrated at step 630.

The process 600 monitors the system to determine if power has been disabled to the removeable component. This is illustrated at step 635. As long as there is power to the removable component the process 600 continues to monitor the power. However, if the power is disconnected, such as through a hot disconnect event or removal of a power cable, the process proceeds to disable the full functionality of the removable component. This is illustrated at step 640. It should be noted that the removable component can still be functioning despite the removal of the external power as it can include onboard back-up power. In some embodiments, power to the rotational motor 210 comes from the end product such that the rotational motor 210 continues to operate even if there are functionality problems with removable component 100. In some embodiments, power to the motor and power for functionality of the removable component can come from the same source and be cut simultaneously when power loss occurs at step 635. In this embodiment, there is stored voltage in either a capacitor or battery connected to the rotational motor so that sufficient power is available to rotate the motor back to the disengaged position.

In response to the removal of the external power the EMC protection device 220 is disengaged. This is illustrated at step 645. The EMC protection device 220 is disengaged by rotating the rotational motor 210 such that the EMC protection device is retracted into the inside of the enclosure of the removable component. This places the EMC protection device in a position such as that illustrated in FIGS. 2 and 3.

Once the EMC protection device 220 is retracted the removable component 100 can then be removed from the end product. This is illustrated at step 650. With the EMC protection device 220 retracted, the removable component 100 can be removed with low plug force and no worry of shearing the gasket of the EMC protection device 220.

If at step 615 the process 600 determined that a power good signal was not detected for the rotational motor 210, the process proceeds to warn the user of this condition. This is illustrated at step 655. This warning can be in the form of error messages in the log of the end product, a visual indicator (e.g., LED), an auditory indicator (e.g., buzzer), etc. If there is no power good signal detected, the process 600 keeps removable component in a not fully activated state. This is illustrated at step 660. For example, in this state, signals are not transmitted or received, output power pins are not enabled, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A retractable electromagnetic compatibility (EMC) protection apparatus for a removable component comprising:
    a motor mounting bracket attached to a side of the removable component,
    a rotational motor coupled to the motor mounting bracket;
    a motor swing arm connected to the rotational motor;
    a protection mounting bracket coupled to the motor swing arm; and
    an EMC protection device coupled to the protection mounting bracket, wherein the EMC protection device is configured to be rotated in and out of an enclosure opening of the removable component in response to rotation of the rotational motor.

2. The EMC protection apparatus of claim 1 wherein the EMC protection device is in a retracted state when power is absent from the EMC protection apparatus.

3. The EMC protection apparatus of claim 2 wherein the rotational motor is configured to rotate the EMC protection device from an engaged state to the retracted state in response to a removal of power from the EMC protection apparatus.

4. The EMC protection apparatus of claim 1 wherein the EMC protection device is in an engaged state when power is present at the EMC protection apparatus.

5. The EMC protection apparatus of claim 4 wherein the rotational motor is configured to rotate the EMC protection device from a retracted state to the engaged state in response to an application of power to the EMC protection apparatus.

6. The EMC protection apparatus of claim 1 wherein the EMC protection device is configured to wipe against a portion of the enclosure opening during rotation.

7. The EMC protection apparatus of claim 1 wherein the EMC protection device is an EMC gasket.

8. The EMC protection apparatus of claim 7 wherein the EMC gasket is bell shaped.

9. The EMC protection apparatus of claim 7 wherein the EMC gasket is configured to compressed between 30% and 70% of an original height of the EMC gasket.

10. The EMC protection apparatus of claim 1 wherein the EMC protection device is an EMC spring.

11. The EMC protection apparatus of claim 1 wherein the retractable EMC protection device is an electrical noise absorber.

* * * * *